(12) United States Patent
Yoshinaga (10) Patent No.: US 6,396,114 B1
(45) Date of Patent: May 28, 2002

(54) MAGNETO-ELECTRIC DEVICE (75) Inventor: Haruo Yoshinaga, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/584,843

(22) Filed: Jun. 1, 2000

(30) Foreign Application Priority Data

Jun. 7, 1999 (JP) .......................................... 11-159355

(51) Int. Cl.$^7$ .............................................. H01L 29/82
(52) U.S. Cl. ...................................... 257/425; 257/421
(58) Field of Search ............................... 324/117, 244.1, 324/249; 250/227.17; 257/421, 425, 422, 427, 424

(56) References Cited

U.S. PATENT DOCUMENTS

| | | | | |
|---|---|---|---|---|
| 5,041,780 A | * | 8/1991 | Rippel | ......................... 324/117 |
| 5,149,962 A | * | 9/1992 | Maurice | ................ 250/227.17 |
| 5,483,161 A | * | 1/1996 | Deeter et al. | ............ 324/244.1 |
| 5,838,154 A | * | 11/1998 | Morikawa et al. | .......... 324/249 |

FOREIGN PATENT DOCUMENTS

| | | |
|---|---|---|
| JP | 59-154085 | 9/1984 |
| JP | 7-198433 | 8/1995 |
| JP | 11-261131 | 9/1999 |

* cited by examiner

*Primary Examiner*—David Nelms
*Assistant Examiner*—Bau T Le
(74) *Attorney, Agent, or Firm*—Sughrue Mion, PLLC

(57) ABSTRACT

A hall device portion 15 is formed in the right side of a silicon substrate 11. A first magnetic film 23 is formed on the surface of an etched groove 19 formed in the reverse side of the silicon substrate 11. A second magnetic film 27 is formed on the surface of an etched groove 19a formed in the silicon substrate 11a. A polyimide layer 25 is used to bond the silicon substrate 11a having the second magnetic film 27 to the right side of the silicon substrate 11. Therefore, the two magnetic films sandwich the hall device portion 15. Therefore, external magnetic fields are efficiently converged to the hall device portion 15 by the first magnetic film 23 and the second magnetic film 27.

10 Claims, 10 Drawing Sheets

MAGNETO-ELECTRIC DEVICE

BACKGROUND OF THE INVENTION

1. Technical Background of the Invention

The present invention relates to a magneto-electric device for use in a magnetic sensor for detecting the number of revolutions of a gear or the like and a manufacturing method therefore.

2. Related Art

In recent years, intelligent household electrical products, industrial machines and automobiles have appeared, causing improvement in a variety of sensor techniques to be required. A hall device which is one of magnetic sensors, is able to output a voltage signal corresponding to the magnetic field. Since the hall device, which is a non-contact type device, is highly resistant against contamination. The hall devices have widely been used. For example, a magnetic sensor incorporating the hall device is employed in a vehicle, such as an automobile, to serve as a rotation sensor for detecting the number of rotation of a gear or the like.

In the foregoing case, the hall device is disposed between a gear (which must be detected) having projections and depressions, and a bias magnet. Thus, an external magnetic field from the bias magnet penetrates the hall device and moves to the surface of the gear having the projections and depressions. Hence it follows that the hall device produces an output of a voltage signal corresponding to the magnitude of the external magnetic field.

When the gear having the projections and depressions has been rotated, the magnetic field is changed due to the projections and depressions of the gear. It leads to a fact that also the magnetic field which penetrates the hall device is changed. The change in the magnetic field causes the voltage signal extracted from the hall device being changed. As a result, the number of revolutions of the groove can be detected in accordance with the change in the voltage signal.

Figure 10A:
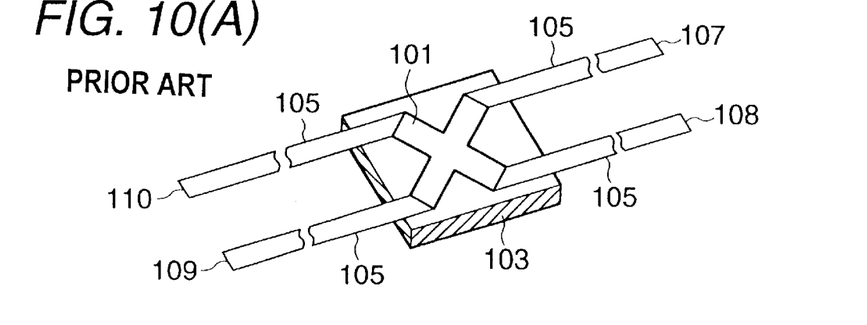
FIG. 10(A) is a diagram showing an example of a conventional hall device provided with a magnetic collector.
Figure 10B:
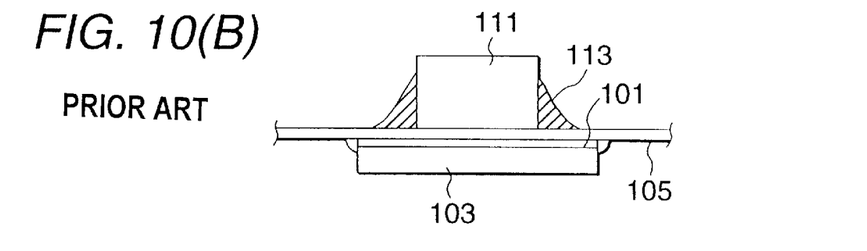
FIG. 10(B) is a cross-sectional view of a conventional hall device shown in FIG. 10(A).

When the sensitivity of the hall device is unsatisfactorily low, a proper output of the detected voltage cannot be obtained. To improve the sensitivity of the hall device in a weak magnetic field, a hall device provided with a magnetic collector has been suggested. FIG. 10(*a*) is a schematic view showing the hall device provided with a magnetic collector. FIG. 10(*b*) is a side view. As can be understood from FIGS. 10(*a*) and 10(*b*), a hall device body 101 formed by a compound semiconductor is formed on a sub-slate formed by NiZn ferrite. Moreover, input/output terminals 107, 108, 109 and 110 are connected to four lead frames 105.

A top jacket 111 constituted by a magnetic collector in the form of a square magnetic member or a cylindrical magnetic member is disposed on the upper surface of the hall device body 101. The top jacket 111, the sub-slate 103 and the lead frames are secured by adhesive agent 113. The top jacket ll converges an external magnetic field to the hall device body 101 so that the sensitivity of the hall device in a weak magnetic field is improved.

Figure 11A:
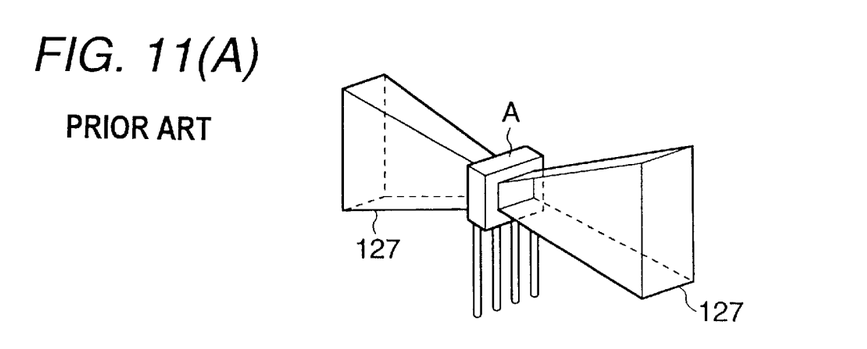
FIG. 11(A) is a diagram showing another example of the conventional hall device provided with a magnetic collector.
Figure 11B:
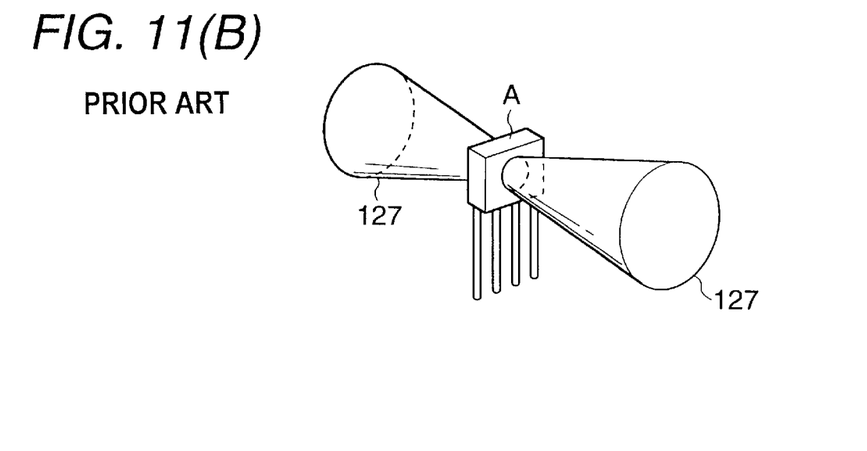
FIG. 11(B) is a diagram showing another example of the conventional hall device provided with a magnetic collector.

In JP Hei.7-198433A, an area flow meter has been disclosed which incorporates a magnetic sensor provided with the magnetic collector. The magnetic sensor provided with the magnetic collector is shown in FIGS. 11(*a*) and 11(*b*). A magnetic collector 127 made of such as permalloy exhibiting excellent permeability formed into a tapered shape is provided for each sensitive surface of the hall device A which is the magnetic sensor. Thus, the magnetic field generated by a magnet is captured by the magnetic collector 127. The captured magnetic field is converged to a base portion of the magnetic collector 127, the base portion having a small diameter. Thus, sensitivity is improved. As a result, the magnetic field is converged to the sensitive surface of the hall device, causing the output of the hall device to be enlarged.

In JP.Sho.59-154085A, a magneto-resistance effect device has been disclosed. The disclosed magneto-resistance effect device incorporates a magnetic collection pattern constituted by a thin ferromagnetic film having, high permeability. The magnetic collection pattern is disposed adjacent to a sensor pattern which is used to detect change in the electric resistance, the magnetic collection pattern being disposed while electric insulation being Maintained through a thin insulating film.

The magneto-resistance effect device disclosed in JP.Sho.59-154085A is effective when it is employed as a ferromagnetic magneto-resistance effect device. The ferromagnetic magneto-resistance effect device includes magnetic members disposed such that the sensor surface has sensitivity in the horizontal direction. On the other hand, a satisfactory effect cannot be obtained from a structure, such as a hall device, in which the surface of the device has sensitivity in the vertical direction.

Each of the hall devices shown in FIGS. 10 and 11 requires an afterward process for bonding the magnetic members to the hall device. It leads to a fact that the overall thickness of the sensor is undesirably enlarged. Moreover, a complicated operation must be performed when each of the magnetic members must be joined to the hall device. As the size of the hall device is reduced, the operation for bonding the magnetic members becomes difficult. Therefore, productivity of the hall devices has been unsatisfactorily low.

Accordingly, the applicant of the invention has applied a magneto-electric device and a manufacturing method therefor in Japanese Patent Publication No. Hei.11-261131 to solve the above-mentioned problems.

Figure 12:
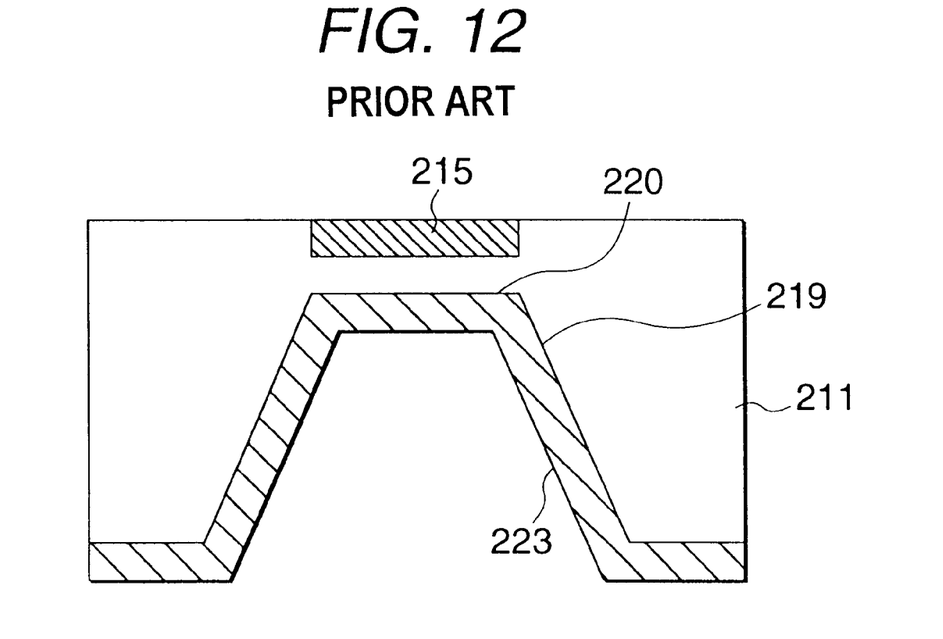
FIG. 12 is a diagram showing a conventional magneto-electric device.

As shown in FIG. 12, the magneto-electric device includes: a silicon substrate 211; and a hall device portion 215 formed adjacent to the surface 213 of the silicon substrate 211 and capable of outputting an electric signal corresponding to the magnitude of the external magnetic field. Moreover, the magneto-electric device incorporates an etched groove 219 which is formed on the reverse side 217 of the silicon substrate 211 at a position opposite to the hall device portion 215. The etched groove 219 is formed into a tapered shape, the diameter of which is gradually reduced as the distance from the reverse side 217 to the hall device portion 215 is shortened. In addition, the magneto-electric device includes a magnetic film 223 formed on the surface of the etched groove 219 and exhibiting a high permeability so as to converge the external magnetic field to the hall device portion 215.

The magneto-electric device having the above-mentioned structure causes the external magnetic field to be converged to the hall device portion 215 due to the magnetic film 223 formed on the surface of the tapered groove. Since the structure is arranged such that the vertical magnetic field is converged to both of the right side and the reverse side of the hall device portion 215, it permits the sensitivity of the hall device to be improved even in a weak magnetic field.

The hall device portion 215 is formed in the silicon substrate 211. Moreover, the magnetic film 223 is formed in the etched groove 219. Thus, excessive enlargement of the thickness from that of original silicon substrate 211 can be prevented. Hence it follows that the size of the device can be reduced. Since a multiplicity of devices and the magnetic film, which must be formed, can be formed on the silicon substrate, the productivity of the hall device can be improved.

Recently, there is a requirement for the conventional magneto-electric device portion of the foregoing type to improve the effect of converging the magnetic field and the sensitivity of the magneto-electric device in a weak magnetic field.

SUMMARY OF THE INVENTION

An object of the present invention is to provide a magneto-electric device which is capable of furthermore improving the sensitivity in a weak magnetic field by improving the effect of converging a magnetic field to the magneto-electric device portion and a manufacturing method therefor.

To achieve the above-mentioned problems, the present invention is provided with a magneto-electric device including:

a first semiconductor wafer including a first surface and a second surface opposite to the first surface;

a magneto-electric device portion provided to the first surface;

a first groove portion recessed from the second surface toward the first surface;

a first magnetic film formed on the second surface and the surface of the first groove portion;

a second semiconductor wafer including a third surface and a fourth surface opposite to the third surface, the second wafer provided so that the magneto-electric device portion is interposed between the first and fourth surfaces;

a second magnetic film formed on the second wafer and located opposite from the first wafer with respect to the magneto-electric device portion;

a bonding portion for bonding the second wafer to the first surface side;

wherein a width of the first groove portion becomes short toward the magneto-electric device portion;

wherein the second magnetic film includes a projection which project toward substantially perpendicular to the third and fourth surfaces;

wherein a second groove portion is etched from the third surface toward the first wafer, the second magnetic film is formed on the second groove portion;

wherein the second groove portion is formed into a trapezoidal shape by anisotropic etching;

wherein a bottom of the second groove portion is located adjacent to the magneto-electric device portion;

wherein a surround recess portion is etched from the forth surface, the surround recess portion surrounds a wafer projection of the second wafer, the second magnetic film is formed on the wafer projection;

wherein the wafer projection is formed into a trapezoidal shape, the surround recess portion is etched by anisotropic etching;

a width of the wafer projection becomes short toward the magneto-electric device portion.

The above-mentioned magneto-electric device has the structure that the magneto-electric device is formed on either side of the first wafer, the first magnetic film is formed on the surface of the tapered groove portion formed on the other side of the first wafer, the second magnetic film is formed on the second wafer and the bonding portion is used to bond the second wafer having the second magnetic film formed thereon to in the surface of the first wafer. Therefore, the magneto-electric device is sandwiched between the magnetic films. Hence it follows that the external magnetic field can efficiently be converged to the magneto-electric device portion by the first and second magnetic films. That is, the vertical magnetic field is converged to the right side and the reverse side of the magneto-electric device portion. Therefore, the sensitivity of the magneto-electric device in a weak magnetic field can furthermore be improved.

A magneto-electric device has the structure that the magnetic projecting portion includes a projection which project toward substantially perpendicular to the third and fourth surfaces.

The above-mentioned magneto-electric device has the structure that the projecting ridge portion which is formed substantially perpendicular to the right side and the reverse side of the magneto-electric device portion is provided for the leading end of the tapered portion. Therefore, a portion of the external magnetic field passes the ridge portion formed at the leading end of the tapered portion toward a direction which is substantially perpendicular to the right side and the reverse side of the magneto-electric device portion. Hence it follows that substantially all magnetic fields which penetrate the magneto-electric device are magnetic fields which are substantially perpendicular to the right side and the reverse side of the magneto-electric device portion. Therefore, the vertical magnetic fields can efficiently be converged. It leads to a fact that the sensitivity of the magneto-electric device in a weak magnetic field can furthermore be improved.

A magneto-electric device has the structure that a second groove portion is recessed from the third surface toward the first wafer, the magnetic projecting portion is formed on the second groove portion.

The magneto-electric device has the structure that the tapered portion is the trapezoidal groove portion formed by anisotropic etching.

A magneto-electric has the structure that a wafer projection is formed as recessing a portion of the fourth surface without recessing the other portion of the fourth surface which corresponding to the wafer projection, the magnetic projecting portion is formed on the wafer projection, and the wafer projection is formed into a trapezoidal shape, the portion of the fourth surface is recessed by anisotropic etching. Therefore, the vertical magnetic fields can be converged to the right side and the reverse side of the magneto-electric device portion. Hence it follows that the sensitivity of the magneto-electric device in a weak magnetic field can furthermore be improved.

The magneto-electric device has the structure that the tapered portion is the projection formed between two trapezoidal groove portions formed by anisotropic etching. Therefore, the vertical magnetic fields which are perpendicular to the right side and the reverse side of the magneto-electric device portion can be converged. Therefore, the sensitivity of the magneto-electric device in a weak magnetic field can furthermore be improved.

A method of manufacturing a magneto-electric device, the magneto-electric device including a semiconductor wafer defining a first surface and a second surface opposite to the first surface, the method includes the steps of:

providing a magneto-electric device portion to the first surface, the magneto-electric device portion outputting an electric signal corresponding to the magnitude of an eternal magnetic field;

forming a first groove portion recessed from the second surface toward the first surface;

forming a first magnetic film on the second surface and the surface of the first groove portion;

providing a second semiconductor wafer so that the magneto-electric device portion put between the first surface and a fourth surface of the second wafer, the second wafer including a third surface and the fourth surface opposite to the third surface; and forming a second magnetic film at the second wafer, the second magnetic film located opposite from the first wafer with respect to the magneto-electric device portion;

wherein a bottom of the first groove portion is positioned adjacent to the magneto-electric device portion.

wherein the providing a second wafer step includes a step of bonding the first and second wafers by a bonding portion;

a step of forming a projection on the second magnetic film, the projection projecting toward substantially perpendicular to the third and fourth surface;

a step of forming a second recess portion etched from the third surface toward the first wafer, the second magnetic film formed on the second groove portion;

wherein the second groove portion is formed into a trapezoidal shape by anisotropic etching;

a step of etching a surround recess portion from the forth surface, the surround recess portion surrounding a wafer projection of the second wafer, the second magnetic film formed on the wafer projection;

wherein a top surface of the wafer projection is positioned adjacent to the magneto-electric device portion;

wherein the wafer projection is formed into a trapezoidal shape, the surround recess portion is etched by anisotropic etching;

wherein a width of the first groove portion becomes short toward the magneto-electric device portion.

DETAILED DESCRIPTION OF PREFERRED EMBODIMENTS

Embodiments of a magneto-electric device and a manufacturing method therefor according to the present invention will now be described with reference to the drawings.

First Embodiment

Figure 1:
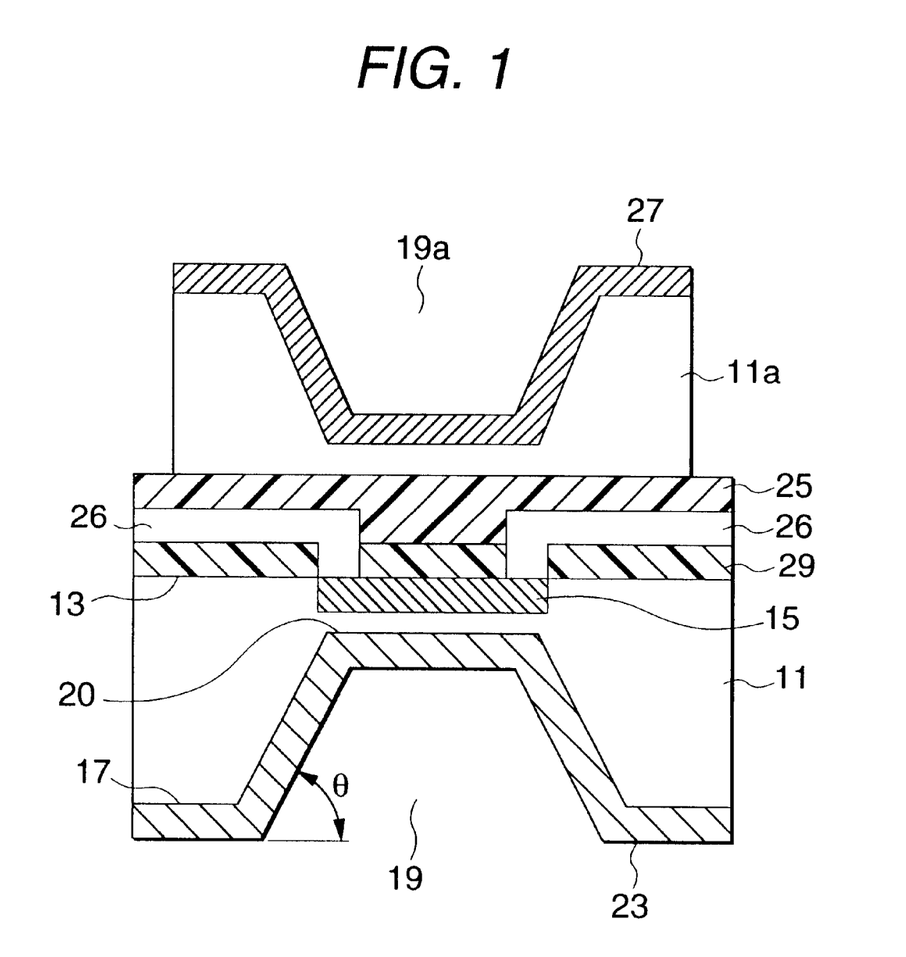
FIG. 1 is a diagram showing a magneto-electric device according to a first embodiment of the present invention.

FIG. 1 is a diagram showing the structure of a magneto-electric device according to a first embodiment of the present invention. Referring to FIG. 1, the structure of the magneto-electric device will now be described. The magneto-electric device portion is a silicon hall device. As shown in FIG. 1, a hall device portion 15 for outputting an electric signal corresponding to the magnitude of the external magnetic field is formed in the surface 13 of a silicon substrate 11 which is a silicon wafer.

A trapezoidal etched groove 19 is formed in a portion in the reverse side 17 of the silicon substrate 11 at a position opposite to the hall device portion 15. The etched groove 19 is formed adjacent to the hall device portion 15.

The etched groove 19 has four inclined surfaces and one groove bottom 20. The etched groove 19 is a tapered groove formed into a trapezoidal shape. The trapezoidal shape has a diameter which is gradually reduced as the distance from the reverse side 17 to the hall device portion 15 is shortened. A first magnetic film 23 formed by permalloy or ferrite having high permeability for converging the external magnetic field to the hall device portion 15 is formed on the surface of the etched groove 19.

The thickness of the silicon substrate 11 is, for example, 350 $\mu$m to 450 $\mu$m. The gap from the groove bottom 20 to the lower surface of the hall device portion 15 is, for example, 10 µm to 50 µm.

An insulating film 29 formed by silicon dioxide ($SiO_2$) or SiN is laminated on the surface of the silicon substrate 11. A wired portion 26 formed by Al (aluminum) and the like is disposed on the second insulating film 29.

A polyimide layer 25 is laminated on the wired portion 26. The polyimide layer 25 having an insulating characteristic is used to bond the silicon substrate 11 and a silicon substrate 11a to each other.

The silicon substrate 11a is laminated on the polyimide layer 25. An etched groove 19a is formed in a portion of the silicon substrate 11a at a position opposite to the hall device portion 15. The etched groove 19a is formed into a tapered shape having a diameter which is reduced as the distance to the hall device portion 15 is shortened. A second magnetic film 27 is laminated on the surface of the etched groove 19a, the second magnetic film 27 being made of a material, such as permalloy or ferrite, exhibiting a high permeability for converging the external magnetic field to the hall device portion 15.

A method of manufacturing the magneto-electric device according to the first embodiment will now be described with reference to FIGS. 2 and 3.

Figure 2A:
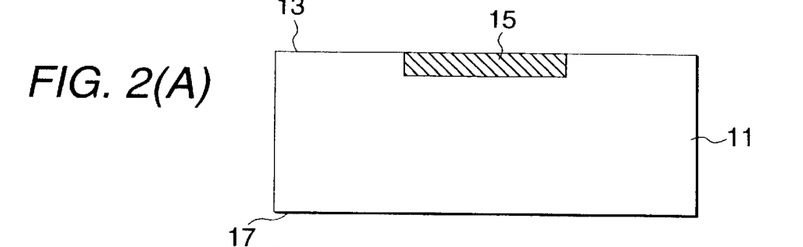
FIG. 2(A) is a first diagram showing a former half portion of a process for manufacturing the magneto-electric device according to the first embodiment.
Figure 2B:
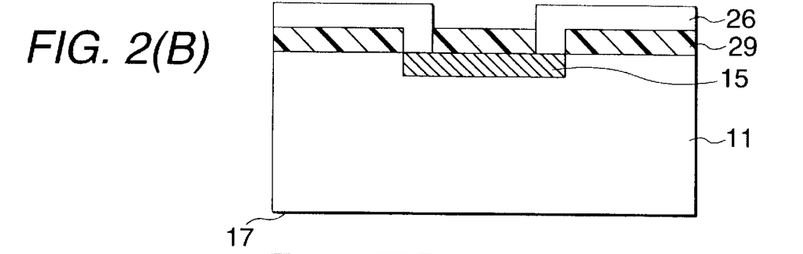
FIG. 2(B) is a second diagram showing a former half portion of a process for manufacturing the magneto-electric device according to the first embodiment.

Initially, as shown in FIG. 2(a), a hall device portion 15 is formed on the surface 13 of the silicon substrate 11 by diffusion of impurities or epitaxial growth. As shown in FIG. 2(b), the insulating film 29 formed by $SiO_2$, SiN or the like is formed on the surface of the surface 13 of the silicon substrate 11. Moreover, a wired portion 26 including lead wires is formed.

Figure 2C:
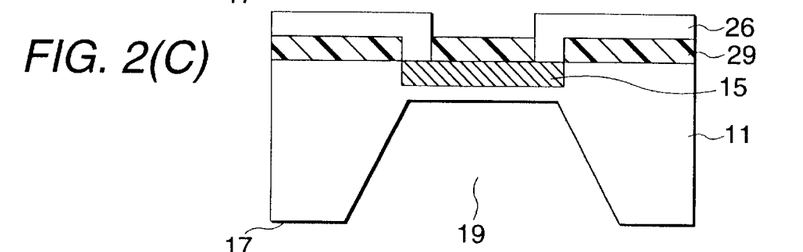
FIG. 2(C) is a third diagram showing a former half portion of a process for manufacturing the magneto-electric device according to the first embodiment.

Then, as shown in FIG. 2(c), the reverse side 17 of the silicon substrate 11 is etched by anisotropic etching at a position opposite to the hall device portion 15 to form the etched groove 19 in a trapezoidal shape.

When a wafer made of Si and having planar orientation near (100) is employed in the foregoing case, an angle θ made between the reverse side 17 and the etched groove 19 is 54.7° (40° to 70° according to the condition). Note that silicon anisotropic etching will be described later.

Figure 2D:
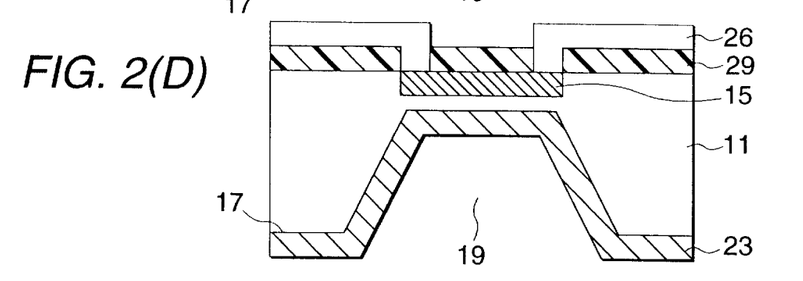
FIG. 2(D) is a fourth diagram showing a former half portion of a process for manufacturing the magneto-electric device according to the first embodiment.
Figure 2E:
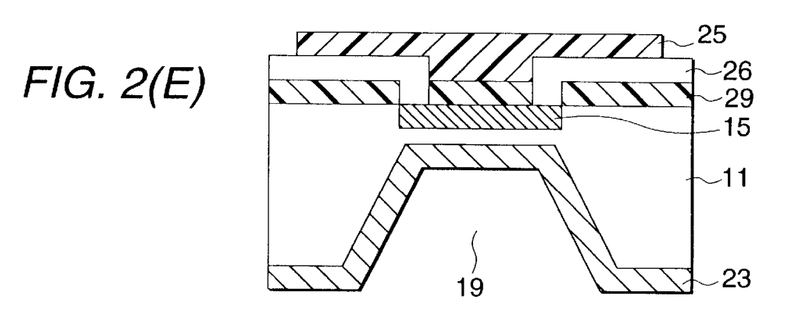
FIG. 2(E) is a fifth diagram showing a former half portion of a process for manufacturing the magneto-electric device according to the first embodiment.

Then, as shown in FIG. 2(d), the first magnetic film 23 having high permeability is formed on the surface of the formed etched groove 19 by evaporation or the like. Moreover, as shown in FIG. 2(e), the polyimide layer 25 is laminated on the upper surface of the wired portion 26.

Figure 3A:
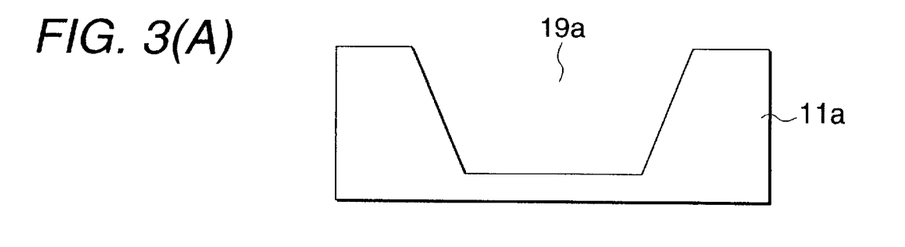
FIG. 3(A) is a first diagram showing a latter half portion of the process for manufacturing the magneto-electric device according to the first embodiment.

Then, as shown in FIG. 3(a), the portion of the right side of the silicon substrate 11a opposite to the hall device portion 15 is etched into a trapezoidal shape by anisotropic etching so that the etched groove 19a is formed.

Figure 3B:
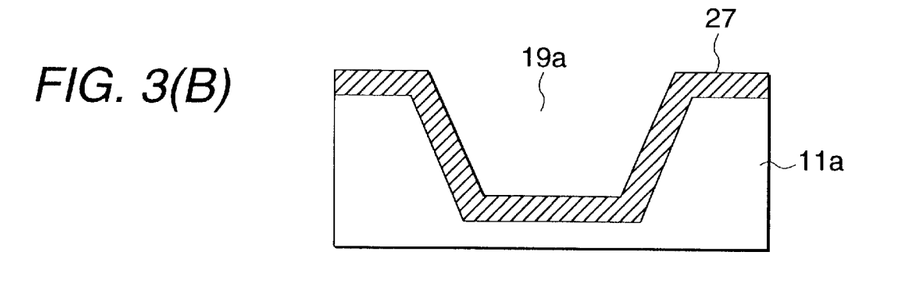
FIG. 3(B) is a second diagram showing a latter half portion of the process for manufacturing the magneto-electric device according to the first embodiment.
Figure 3C:
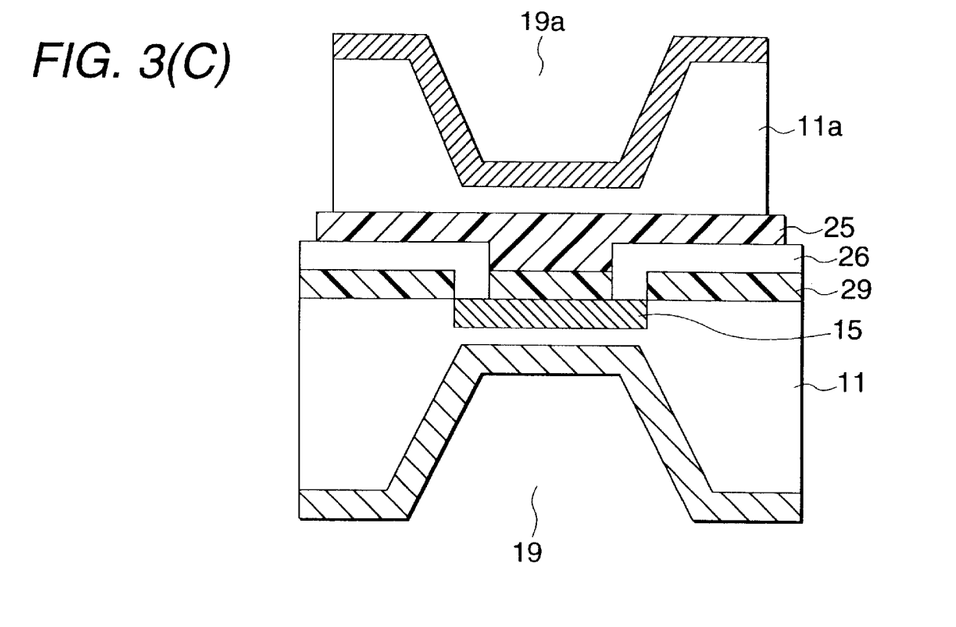
FIG. 3(C) is a third diagram showing a latter half portion of the process for manufacturing the magneto-electric device according to the first embodiment.

Then, as shown in FIG. 3(b), the second magnetic film 27 having the high permeability is formed on the surface of the formed etched groove 19a by evaporation or the like. As shown in FIG. 3(c), the polyimide layer 25 is formed on the reverse side of the silicon substrate 11a. Then, the polyimide layer 25 formed on the silicon substrate 11a and the polyimide layer 25 formed on the silicon substrate 11 are used to bond the silicon substrate 11a to the silicon substrate 11.

The bonding process is performed by an ELVIC (Elemental Level Vertically Integrated Circuit) technique with which two LSI chips are caused to face each other and bonded to each other to perform diffusion welding so as to electrically connecting the upper and lower circuits to each other so that an LSI having a two-layer structure is realized.

Thus, the hall device having the collector can be formed in which the first magnetic film 23 and the second magnetic film 27 are disposed adjacent to the hall device portion 15.

As described above, the hall device according to the first embodiment has the structure that the silicon substrate 11 having the first magnetic film 23 formed thereon and the silicon substrate ha having the second magnetic film 27 formed thereon are bonded to each other. Thus, the two magnetic films sandwich the hall device portion 15.

Therefore, the external magnetic field from the bias magnet passes through the groove bottom 20 and the gaps by the first magnetic film 23 and the second magnetic film 27 so as to efficiently be converged to the hall device portion 15. That is, the vertical magnetic fields are efficiently be converged to the right side and the reverse side of the hall device portion 15. Thus, the sensitivity of the hall device in a weak magnetic field can furthermore be improved.

An IC process, such as silicon anisotropic etching, is performed to form the hall device portion 15 in the silicon substrate 11. Moreover, the first magnetic film 23 is provided for the etched groove 19. Therefore, great enlargement of the thickness as compared with the original thickness can be prevented. As a result, the size can be reduced.

A multiplicity of devices, the first magnetic film 23 and the second magnetic film 23 can be formed on the silicon substrates 11 and 11a. Therefore, the productivity of the hall device can be improved. Since the silicon substrates 11 and 11a are employed, IC (Integrated Circuit), such as an amplifying circuit, can be included in the portion except for the hall device.

Second Embodiment

Figure 4:
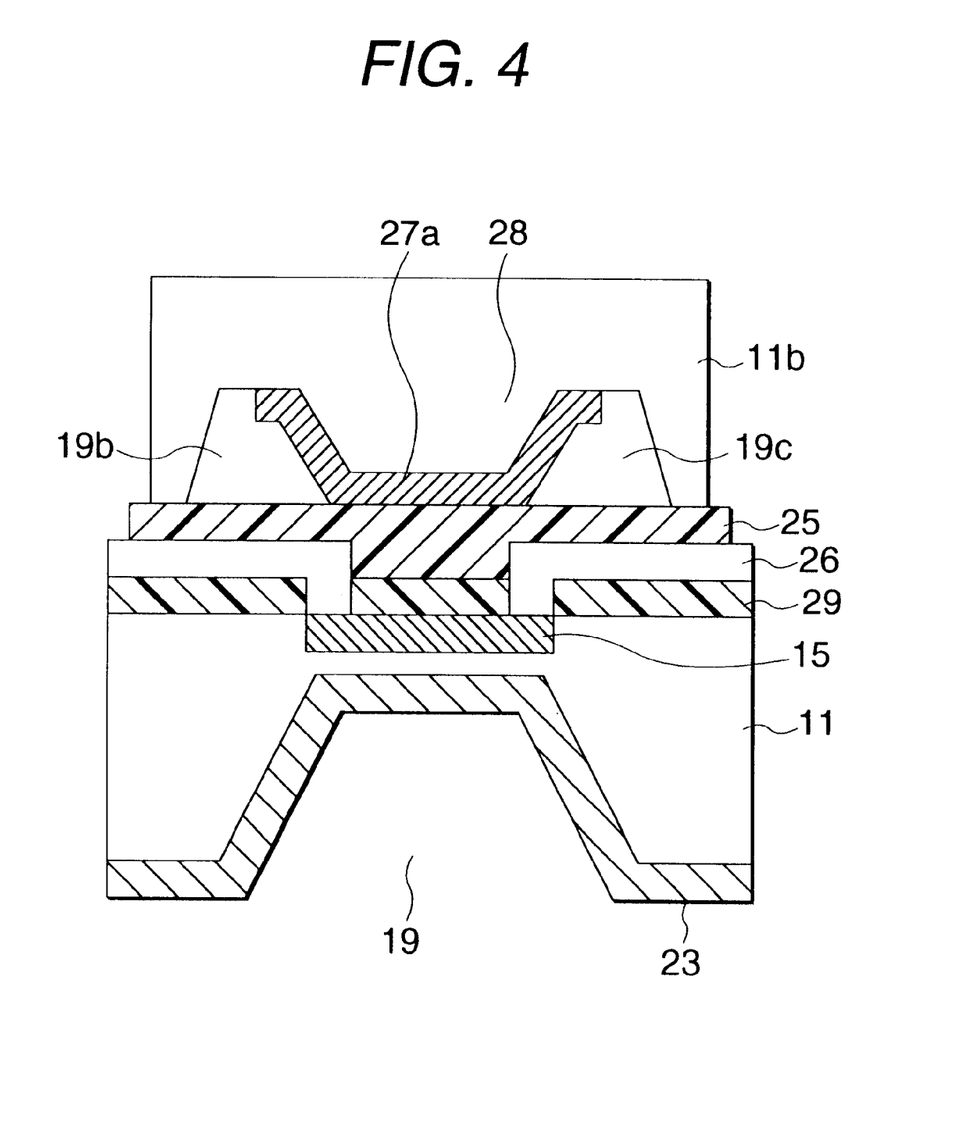
FIG. 4 is a diagram showing a magneto-electric device according to a second embodiment of the present invention.

A magneto-electric device and a manufacturing method therefor according to a second embodiment of the present invention will now be described with reference to the drawings. FIG. 4 is a diagram showing the structure according to the second embodiment of the present invention.

The magneto-electric device according to the first embodiment includes the second magnetic film 27 provided for the etched groove 19a. The magneto-electric device according to the second embodiment incorporates the second magnetic film 27 provided for a projection. The structure of the silicon substrate 11 shown in FIG. 4 is the same as that of the silicon substrate shown in FIG. 1. Therefore, the structure is omitted from description.

Two etched grooves 19b and 19c are formed in either surface of the silicon substrate 11b at positions apart from each other for a predetermined distance. A trapezoidal projection 28 is formed between the two etched grooves 19b and 19c. A second magnetic film 27a made of a material, such as permalloy or ferrite, having high permeability is formed on the surface of the projection 28. The silicon substrate 11b having the second magnetic film 27a formed thereon is bonded to the silicon substrate 11 by the polyimide layer 25.

Figure 5:
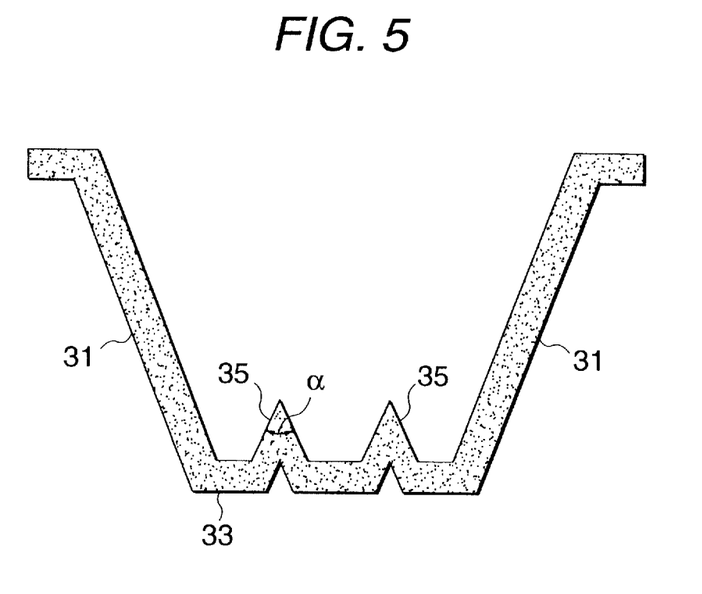
FIG. 5 is a diagram showing a second magnetic film provided for the magneto-electric device according to the second embodiment.
Figure 6:
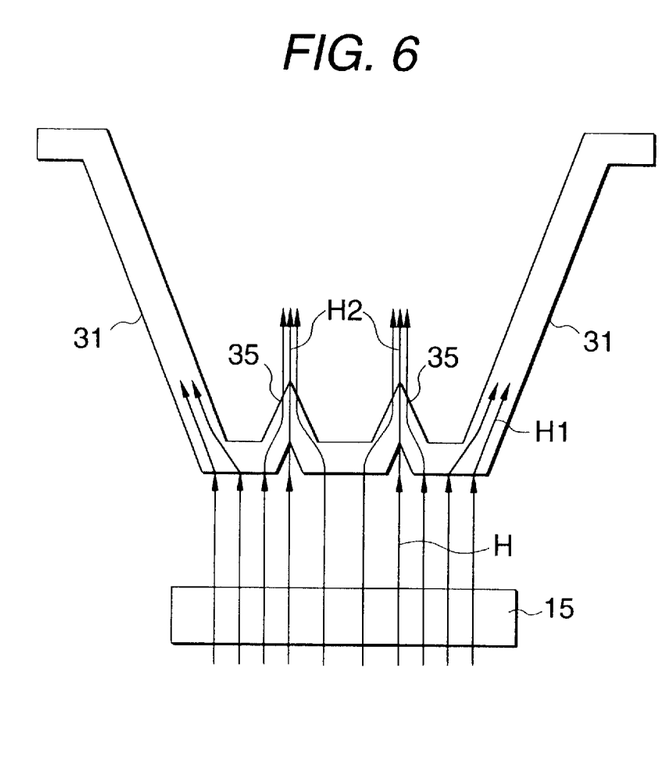
FIG. 6 is a graph showing the distribution of magnetic fluxes of the second magnetic film shown in FIG. 5.

FIG. 5 is a diagram showing the detailed structure of a second magnetic film provided for the magneto-electric device according to the second embodiment. FIG. 6 is a graph showing distribution of magnetic fluxes in the second magnetic film shown in FIG. 5. The second magnetic film 27a incorporates two inclined portions 31 and a bottom 33 connected to the bottom 33. Two ridges 35 in the form of projections are provided for the bottom 33 in a direction substantially perpendicular (in the upper direction in this embodiment) to the right side and the reverse side of the hall device portion 15. The number of ridges may be changed to correspond to the width of the hall device portion 15. It is preferable that the angle α of each of the ridges 35 is about 54.7°.

A method of manufacturing the magneto-electric device according to the second embodiment will now be described with reference to FIG. 7. FIG. 7 is a diagram showing a latter half of the process for manufacturing the magneto-electric device according to the second embodiment. The former half of the process for manufacturing the magneto-electric device according to the second embodiment is the same as the former half of the process for manufacturing the magneto-electric device according to the first embodiment shown in FIG. 2. Therefore, the former half is omitted from described. The latter half of the manufacturing process will now be described with reference to FIG. 7.

Figure 7A:
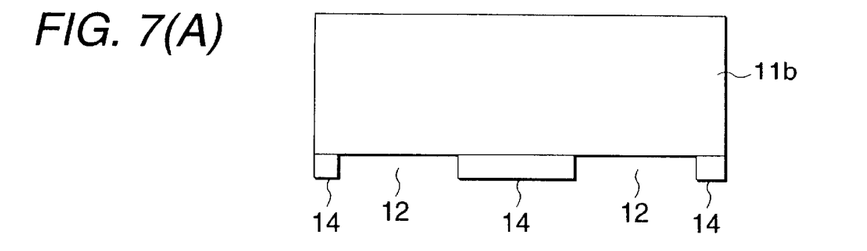
FIG. 7(A) is a first diagram showing a latter half portion of a process for manufacturing the magneto-electric device according to the second embodiment.
Figure 7B:
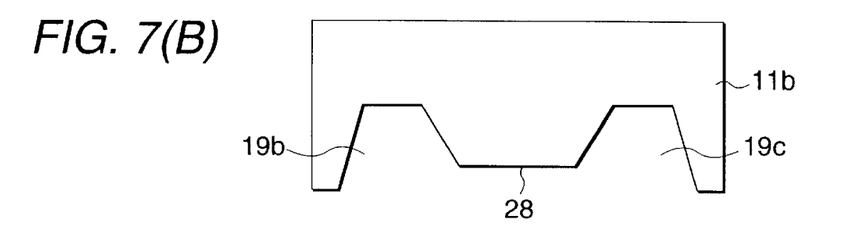
FIG. 7(B) is a second diagram showing a latter half portion of a process for manufacturing the magneto-electric device according to the second embodiment.

As shown in FIG. 7(a), two recesses 12 are formed such that a mask portion 14 of the reverse side of the silicon substrate 11b is masked. Then, as shown in FIG. 7(b), the recess 12 is etched in the trapezoidal form by silicon anisotropic etching so that an etched groove 19b and 19c are formed.

Figure 7C:
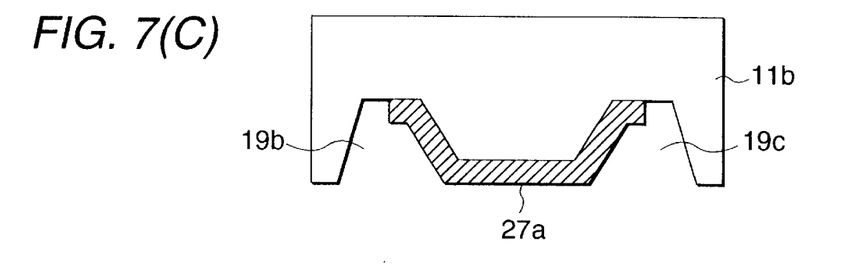
FIG. 7(C) is a third diagram showing a latter half portion of a process for manufacturing the magneto-electric device according to the second embodiment.

Then, as shown in FIG. 7(c), a second magnetic film 27a having high permeability is formed by evaporation or the like on the surface of the projection 28 formed between the formed etched grooves 19b and 19c.

Figure 7D:
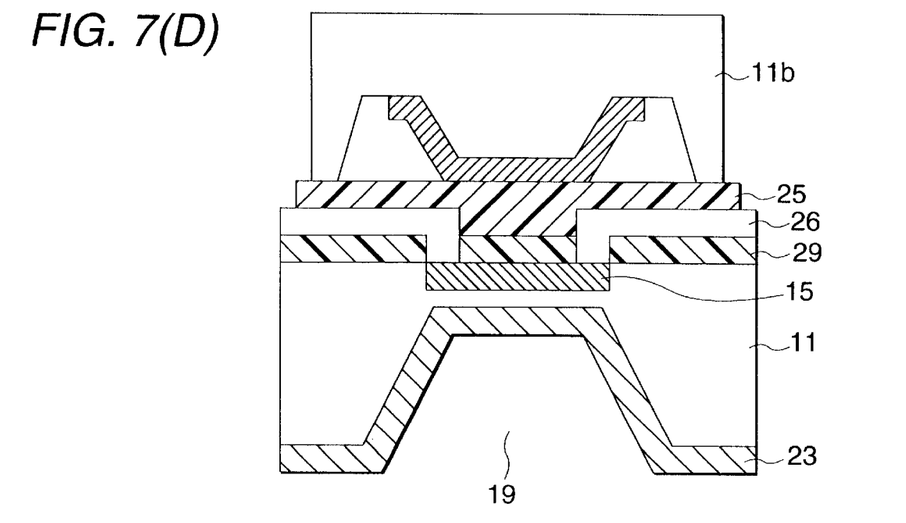
FIG. 7(D) is a fourth diagram showing a latter half portion of a process for manufacturing the magneto-electric device according to the second embodiment.

Then, as shown in FIG. 7(d), the polyimide layer 25 is formed on the reverse side of the silicon substrate 11b. Then, the polyimide layer 25 provided for the silicon substrate 11b and the polyimide layer 25 provided for the silicon substrate 11 are used to bond the silicon substrate 11b to the silicon substrate 11. Thus, the hall device provided with the magnetic collector can be formed in which the first magnetic film 23 and the second magnetic film 27a are formed adjacent to the hall device portion 15.

As described above, the hall device according to the second embodiment has the structure that the silicon substrate 11 having the first magnetic film 23 formed thereon and the silicon substrate 11b having the second magnetic film 27a formed thereon are bonded to each other. Thus, the hall device portion 15 is sandwiched between the two magnetic films. Therefore, also the magneto-electric device according to the second embodiment attains a similar effect obtainable from the magneto-electric device according to the first embodiment.

In the foregoing case, an external magnetic field H passes through the hall device portion 15, as shown in FIG. 6. A part of the external magnetic field H1 is introduced into the two inclined portions 31. The ridges 35 in the form of projections are provided on the bottom 33 which is the leading end of the projection 28 in the direction substantially perpendicular to the right side and the reverse side of the hall device portion 15. Therefore, the residual magnetic field H2 of the external magnetic field H passes through the ridges 35 toward the direction substantially perpendicular to the right side and the reverse side of the hall device portion 15, that is, an upward direction.

Therefore, substantially all magnetic fields penetrating the hall device portion 15 are magnetic fields which are substantially perpendicular to the right side and the reverse side of the hall device portion 15. Thus, the vertical magnetic field can efficiently be converged. As a result, the sensitivity of the magneto-electric device in a weak magnetic field can furthermore be improved.

Silicon Anisotropic Etching

The silicon anisotropic etching process according to the first to third embodiments will now be described The silicon anisotropic etching process is an etching process for anisotropically etching silicon by using a kind of alkali etching solution. The reason for this lies in that the etching rate varies according to the orientation of the crystal plane. When the foregoing characteristic is used, an etched groove which is narrow in the lateral direction and deep in the vertical direction can be formed. The etching solution is exemplified by EDP, KOH, $N_2H_4$, NaOH, and the like.

Figure 8A:
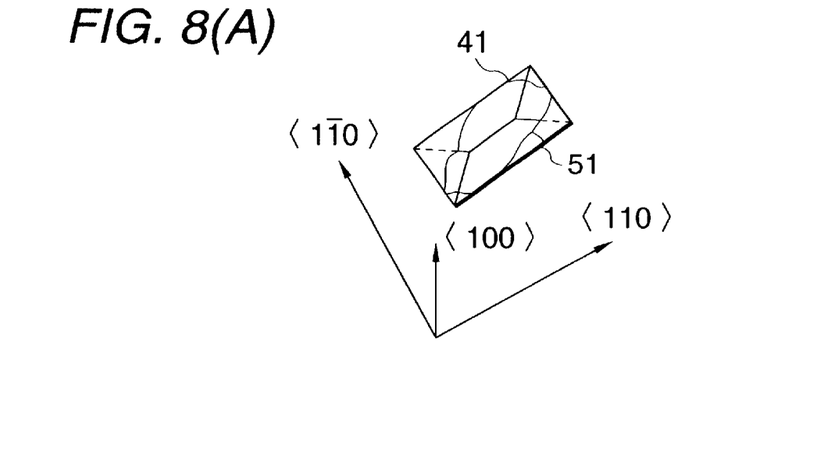
FIGS. 8(A) (B), and 8(C) diagrams showing the shape of a silicon wafer having the plane (100) realized by etching.
Figure 8B:
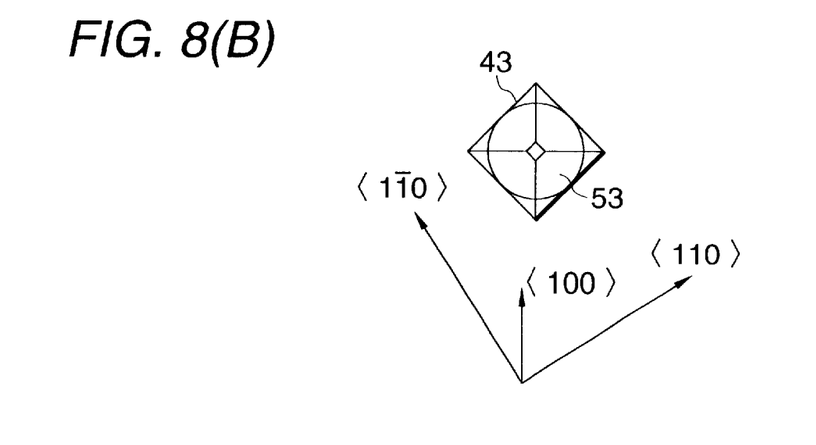
Figure 8C:
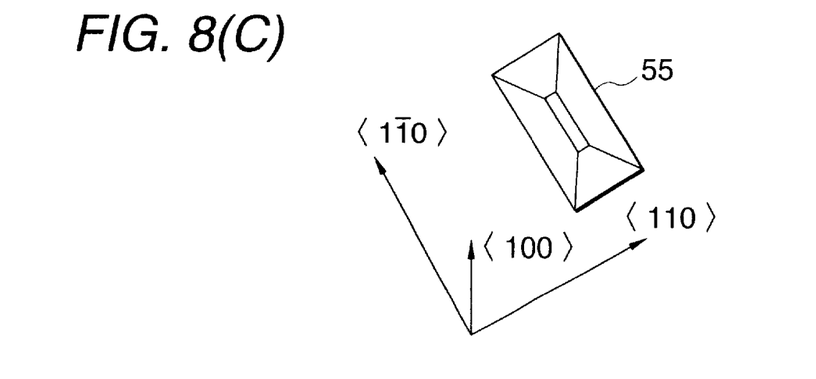

FIGS. 8(A), 8(B) and 8(C) show shapes of silicon wafers having plane (100) realized by etching. When deep silicon etching of the silicon substrate having the plane (100) is performed though a mask window for etching, an etched groove formed by four sides arranged in the direction (110) is formed on the plane (100).

The shape of the groove formed by the etching process varies according to the shape of the etching window. As shown in FIG. 8(A), an etched groove 41 is formed into a rectangular shape circumscribing a mask window 51 having an arbitrary shape. As shown in FIG. 8(B), an etched groove 43 is formed into a rectangular shape (a square) circumscribing a circular mask window 53. FIG. 8(C) shows a shape realized by etching performed through a rectangular mask window 55 having the side arranged in the direction of (110).

Figure 9:
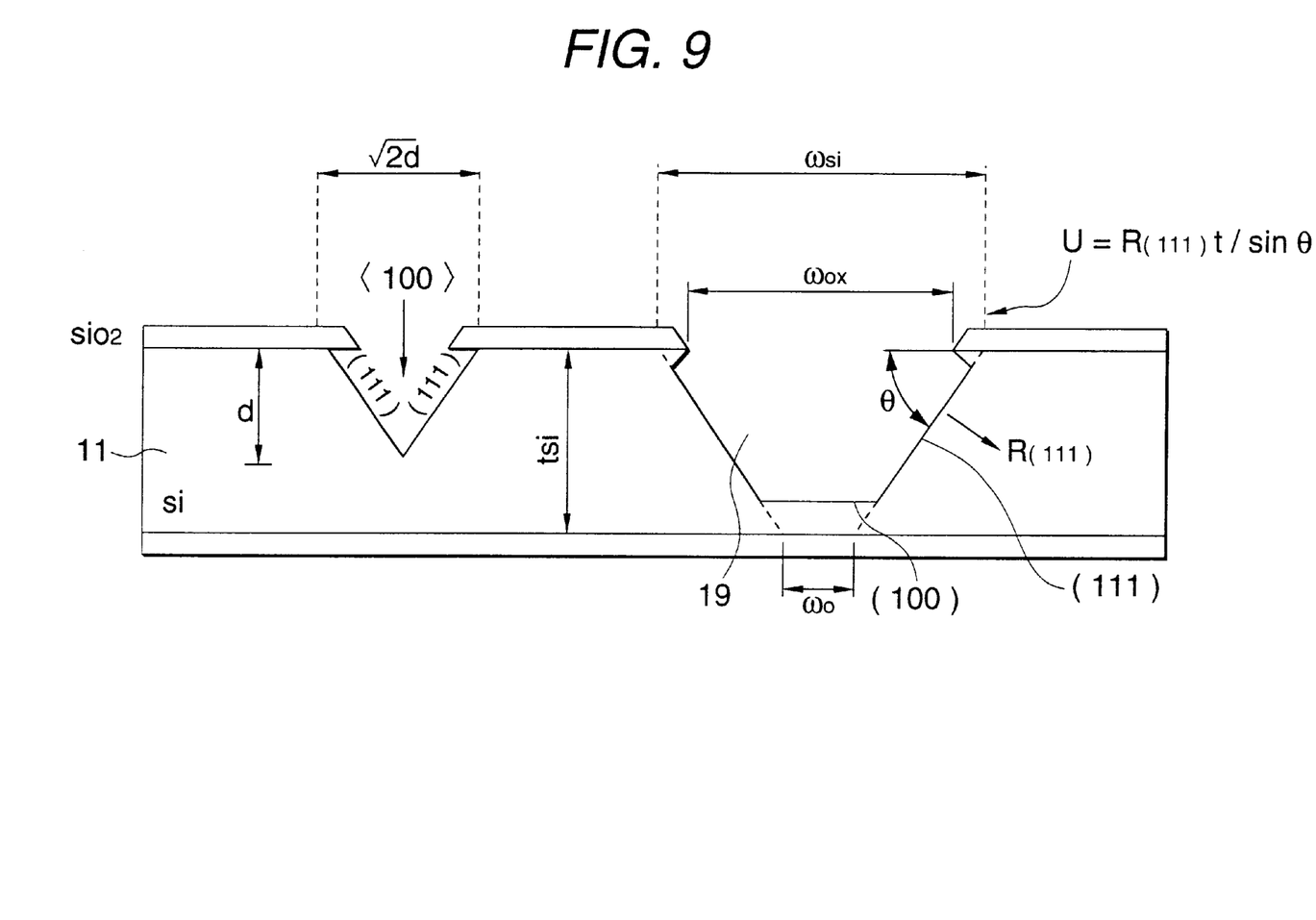
FIG. 9 is a cross-sectional view showing the shape of a silicon wafer having the plane (100) realized by etching.

FIG. 9 is a cross sectional view showing the shape of the silicon wafer having the plane (100) and realized by etching. The etched groove is formed by four walls arranged in the direction of the plane (111). When the groove has a small size, the etched groove is formed into an inverted pyramid shape as shown in the left-hand portion of the drawing. Thus, etching is automatically stopped. Since the plane (111) is inclined by an angular degree of 54.7 degrees from the plane (100), the depth of etching is a value obtained by dividing the side of the etched groove by the square root of two.

The present invention is not limited to the magneto-electric device according to the first and second embodiments. The magneto-electric devices according to the first and second embodiments may be combined with each other. For example, the ridges 35 of the second magnetic film 27a provided for the magneto-electric device according to the second embodiment may be provided for the second magnetic film 27 provided for the magneto-electric device according to the first embodiment.

In the first and second embodiments, the silicon substrate 11 is the silicon wafer, silicon anisotropic etching is performed and the magnetic film is formed on the surface of each of the etched grooves 19 and 19a to converge the vertical magnetic field to the silicon wafer. Therefore, a magneto-electric device except for the silicon hall device may be employed if the device can be formed on the silicon wafer and the device has sensitivity in the vertical direction.

In the first and second embodiments, the etched groove 19 is formed into the trapezoidal shape. The shape is not limited to the trapezoidal shape. Any shape may be employed if the diameter of the employed shape is gradually reduced as the distance from the reverse side to the hall device portion 15 is shortened. Therefore, a tapered square groove and a tapered cylindrical groove may be employed.

Effect of the Invention

The magneto-electric device and the method of manufacturing a magneto-electric device has the structure that the magneto-electric device portion is formed on either side of the first wafer, the first magnetic film is formed on the surface of the tapered groove formed in the other side of the first wafer, the second magnetic film is formed on the surface of the tapered portion provided for the second wafer and the bonding portion is used to bond the second wafer having the second magnetic film to the surface of the first wafer. Therefore, the magnetic films sandwich the magneto-electric device. Hence it follows that the external magnetic field can efficiently be converged to the magneto-electric device portion by the first and second magnetic films. Since the vertical magnetic field is converged to the right side and the reverse side of the magneto-electric device portion, the sensitivity of the magneto-electric device in a weak magnetic field can furthermore be improved.

The magneto-electric device and the method of manufacturing a magneto-electric device have the structure that the ridge portion in the form of a projection is provided for the leading end of the tapered portion in a direction substantially perpendicular to the right side and the reverse side of the magneto-electric device portion. Therefore, a portion of the external magnetic field passes through the ridge portion formed at the leading end of the tapered portion toward the direction substantially perpendicular to the right side and the reverse side of the magneto-electric device portion. Thus, substantially all magnetic fields penetrating the magneto-electric device portion are magnetic fields which are substantially perpendicular to the right side and the reverse side of the magneto-electric device. Since the vertical magnetic field can efficiently be converged, the sensitivity of the magneto-electric device in a weak magnetic field can furthermore be improved.

The magneto-electric device and the method of manufacturing a magneto-electric device have the structure that the tapered portion is the trapezoidal groove portion formed by anisotropic etching. Therefore, the vertical magnetic field can be converged to the right side and the reverse side of the magneto-electric device portion. Hence it follows that the sensitivity of the magneto-electric device in a weak magnetic field can furthermore be improved.

The magneto-electric device and the method of manufacturing a magneto-electric device have the structure that the tapered portion is the projection formed between the two trapezoidal groove portion formed by anisotropic etching. Therefore, the vertical magnetic field can be converged to the right side and the reverse side of the magneto-electric device portion. Hence it follows that the sensitivity of the magneto-electric device in a weak magnetic field can furthermore be improved.

What is claimed is:

1. A magneto-electric device comprising:
   a first semiconductor wafer including a first surface and a second surface opposite to said first surface;
   a magneto-electric device portion provided on said first surface;
   a first groove portion recessed from said second surface toward said first surface;
   a first magnetic film formed on said second surface and the surface of said first groove portion;
   a second semiconductor wafer including a third surface and a fourth surface opposite to said third surface, said second wafer provided so that said magneto-electric device portion is interposed between said first and fourth surfaces;
   a second magnetic film formed on said second wafer and located opposite from said first wafer with respect to said magneto-electric device portion.

2. A magneto-electric device according to claim 1 further comprising a bonding portion for bonding said second wafer to said first surface side.

3. A magneto-electric device according to claim 1, wherein a width of said first groove portion becomes short toward said magneto-electric device portion.

4. A magneto-electric device according to claim 1, wherein said second magnetic film includes a projection which project toward substantially perpendicular to said third and fourth surfaces.

5. A magneto-electric device according to claim 1, wherein a second groove portion is etched from said third surface toward said first wafer, said second magnetic film is formed on said second groove portion.

6. A magneto-electric device according to claim 5, wherein said second groove portion is formed into a trapezoidal shape by anisotropic etching.

7. A magnetic-electric device according to claim 5, wherein a bottom of said second groove portion is located adjacent to said magneto-electric device portion.

8. A magneto-electric device according to claim 1, wherein a surround recess portion is etched form said fourth surface, said surround recess portion surrounds a wafer projection of said second wafer, said second magnetic film is formed on said wafer projection.

9. A magneto-electric device according to claim 8, wherein said wafer projection is formed into a trapezoidal shape, said surround recess portion is etched by anisotropic etching.

10. A magneto-electric device according to claim 8, a width of said wafer projection becomes short toward said magneto-electric device portion.

* * * * *